Figure 1:
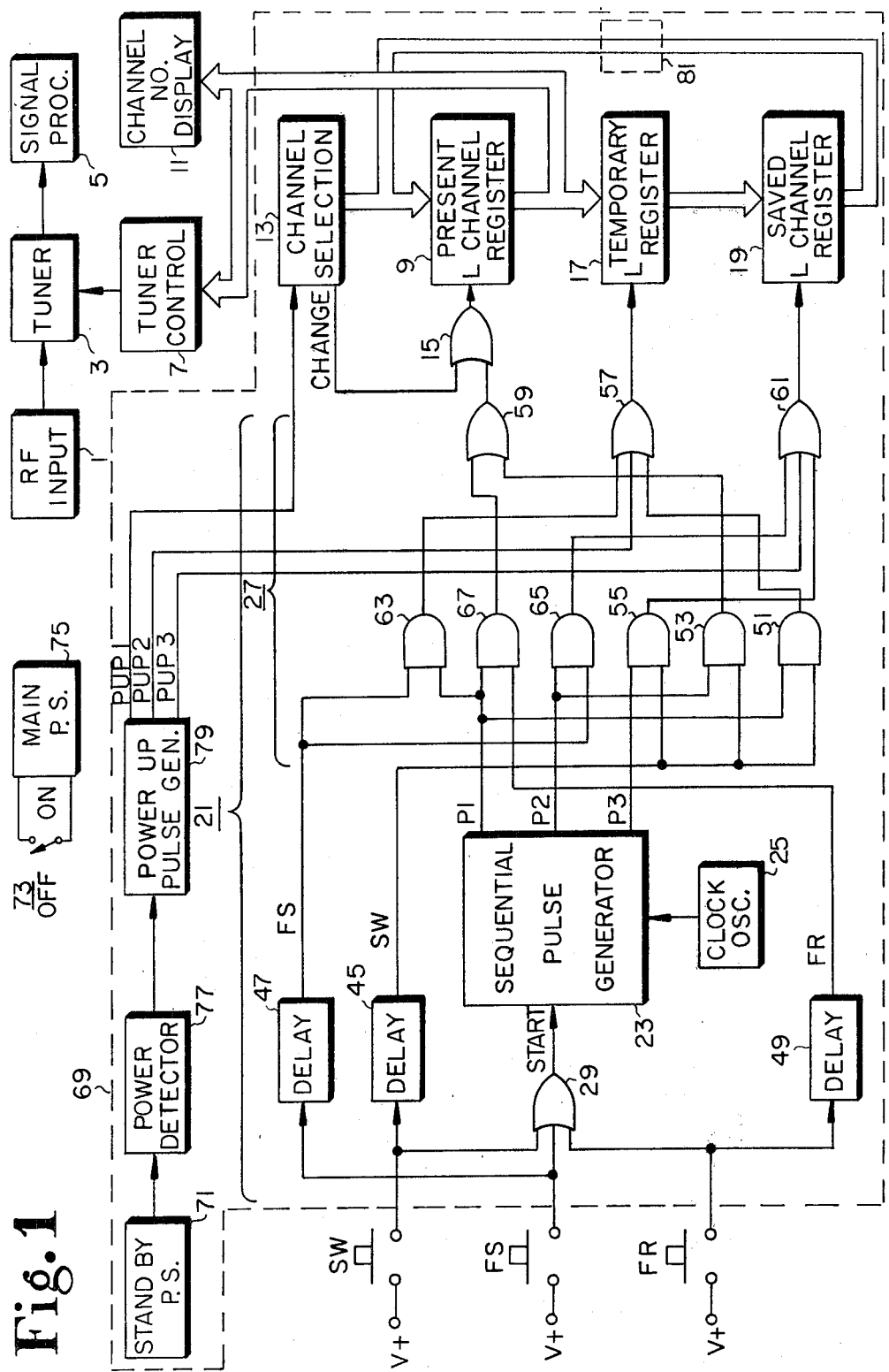

United States Patent [19]

Tults

[11] 4,367,559
[45] Jan. 4, 1983

[54] ARRANGEMENT FOR BOTH CHANNEL SWAPPING AND FAVORITE CHANNEL FEATURES

[75] Inventor: Juri Tults, Indianapolis, Ind.
[73] Assignee: RCA Corporation, New York, N.Y.
[21] Appl. No.: 232,213
[22] Filed: Feb. 6, 1981
[51] Int. Cl.³ .............................................. H04B 1/16
[52] U.S. Cl. .................................... 455/186; 455/166
[58] Field of Search .............. 455/161, 165, 166, 185, 455/186; 358/191.1

[56] References Cited

U.S. PATENT DOCUMENTS 3,953,801  4/1976  Podowski .
3,965,336  6/1976  Grohmann ......................... 455/186
4,271,532  6/1981  Wine .

FOREIGN PATENT DOCUMENTS 1208849  10/1970  United Kingdom .
1363048   8/1974  United Kingdom .
1471712   4/1977  United Kingdom .
1510871   5/1978  United Kingdom .
1551104   8/1979  United Kingdom .

OTHER PUBLICATIONS

"Farbfernsehgerat mit Mikroprocessor-Steuerung", by Wolfgang Baum, pp. 61-66 of German Language Magazine, Funkshau, 1977, Heft 17.
"A Systems Approach to Low-Cost Electronic Tuning Address", by B. Howell, J. Reid and F. Zlotnick, pp. 408-416 of the IEEE Transactions on Consumer Electronics, vol. CE-24, No. 3, Aug. 1978.

Primary Examiner—Jin F. Ng
Attorney, Agent, or Firm—E. M. Whitacre; P. J. Rasmussen; P. M. Emanuel

[57] ABSTRACT

The channel selection apparatus of a tuning system includes a present channel number register, a temporary register, a saved channel number register and a control unit for selectively controlling the three registers to (a) interchange the contents of the present and saved channel number registers when a swap key is activated, (b) enter the contents of the present channel number register in the saved channel number register without disturbing the contents of the present channel register when a favorite channel store key is activated, and (c) enter the contents of the saved channel number register in the present channel number register without disturbing the contents of the saved channel number register when a favorite channel recall key is activated.

5 Claims, 3 Drawing Figures

ARRANGEMENT FOR BOTH CHANNEL SWAPPING AND FAVORITE CHANNEL FEATURES

The present invention pertains to the field of electronic channel selection apparatus as may be employed in a television receiver.

U.S. Patent application Ser. No. 93,229 entitled "Receiver with a Channel Swapping Apparatus" filed Nov. 13, 1979, in the name of C. M. Wine, issued on June 2, 1981 as U.S. Pat. No. 4,271,532, discloses an electronic arrangement for selectively interchanging a presently selected channel with one previously selected by activating a single "swap" button provided for that purpose. Such an arrangement allows a user to conveniently and rapidly switch between two programs. Such an arrangement is therefore very useful, e.g., for allowing a user to contemporaneously follow the progress of two sporting events on two different channels.

Since the swapping operation in the Wine arrangement, unlike prior swapping arrangements, is not activated by the selection of a new channel, it may also be used to store an originally selected channel while a number of other channels are selected during a search to determine if something more interesting than what is on the originally selected channel is available and then returning to the originally selected channel. However, since the starting point of such an operation in the Wine arrangement is storing the originally selected channel, it is not particularly well suited to immediately selecting a certain favorite channel without regard to the originally selected channel before a search. In other words, the Wine arrangement only permits the channel originally selected before a search to be immediately recalled.

Thus, apparatus which enables a user to store and then unconditionally recall a favorite channel which is frequently watched is desirable. E.g., the use of cable converters and video tape and disk players has made a favorite channel feature particularly desirable since when such systems are used, the television receiver must be tuned to a predetermined channel, e.g., in the United States channel 03 or 04. In addition, since channel swapping and favorite channel features are different, apparatus which provides both features is also desirable.

In accordance with one aspect of the present invention, in a tuning system including a present channel register for storing the channel number of a presently selected channel and a saved channel register for storing a previously stored channel number, favorite channel store and favorite channel recall means are provided for independently generating corresponding signals. Control means causes the contents of the present channel register to be entered in the saved channel register without disturbing the contents of the present channel register in response to the favorite channel store signal and causes the contents of the saved channel register to be entered in the present channel register without disturbing the contents of the saved channel register in response to the favorite channel recall signal.

In accordance with another aspect of the present invention, channel swap means for generating a corresponding signal independently of the favorite channel store and recall signals are also provided. The control means causes the exchange of the contents of the present and saved channel registers in response to the channel swap signal.

A channel selection apparatus of a television receiver embodying the present invention is shown, partially in block diagram form and partially in logic diagram form in FIG. 1 of the accompanying Drawing.

Figure 2:
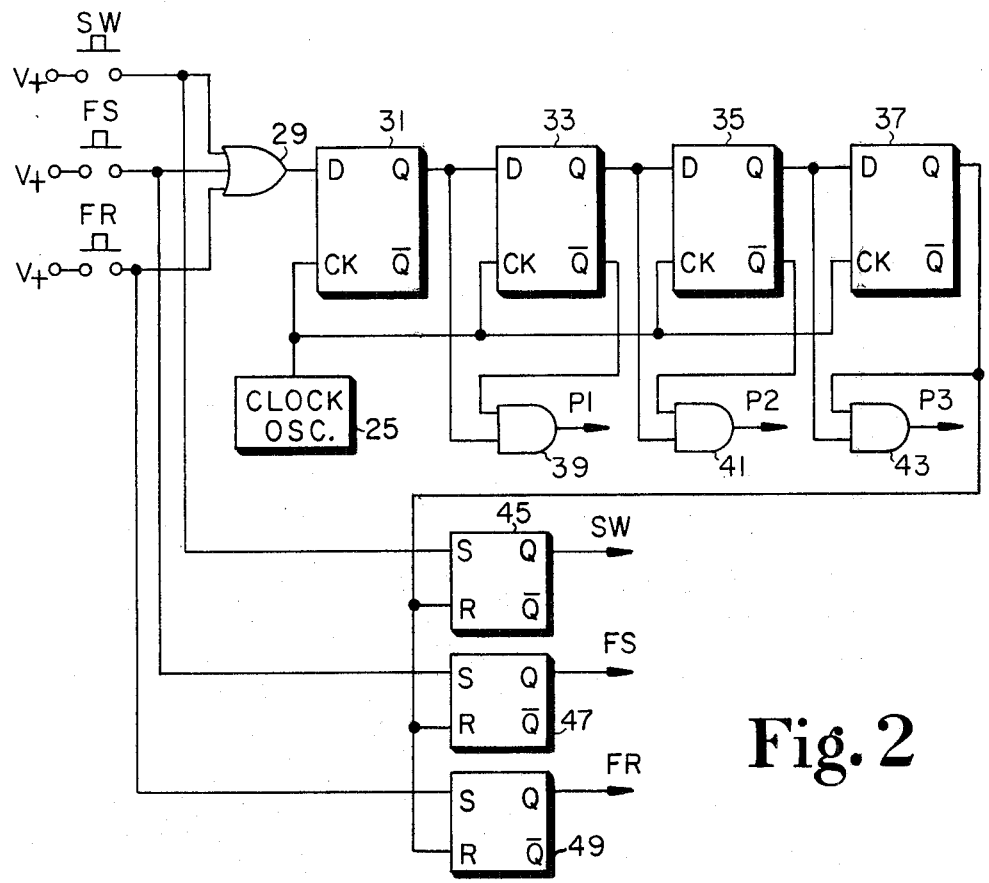

The logic diagram of an implementation of a portion of the channel selection apparatus of FIG. 1 is shown in FIG. 2.

Figure 3:
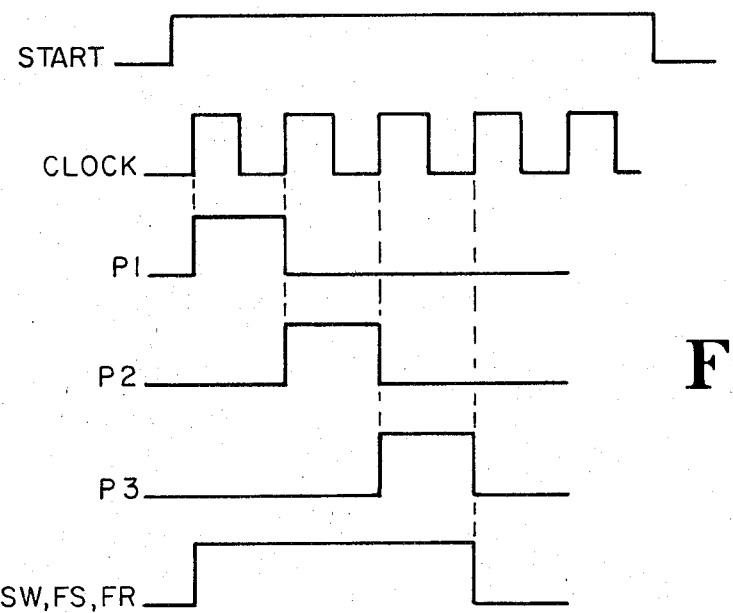

The timing diagram for the structure of FIG. 2 is shown in FIG. 3.

In FIG. 1, a television receiver includes an RF output 1 for receiving RF carriers provided, e.g., by an antenna, video tape player or video disk player and a tuner 3 for heterodyning the received RF carrier to produce an IF signal. The IF signal is coupled to a signal processing portion 5 for processing television signals in the conventional fashion to produce video and audio responses.

Tuner 3 selects the RF carrier associated with a selected channel and generates a local signal, with which the selected RF carrier is heterodyned, having the appropriate frequency for the selected channel in accordance with the magnitude of a tuning voltage generated by a tuner control unit 7. Tuner control unit 7 converts binary signals representing the tens and units digits of the channel number of a presently selected channel stored in a register 9 to a corresponding tuning voltage. U.S. Pat. No. 4,031,549, entitled "Television Tuning System with Provisions for Receiving RF Carrier at Nonstandard Frequency", issued in the name of Rast et al. discloses a phase locked loop system suitable for use as tuning control unit 7 and is therefore incorporated by reference. A channel number display unit 11 is responsive to the binary signals stored in register 9 for displaying the channel number of the presently selected channel.

A channel selection unit 13 generates the binary signals representing the channel number of the presently selected channel. Channel selection unit 13 may, e.g., include a calculator-like keyboard having a key for each of the digits 0 through 9. In that case, after each the tens and units digits of a channel number have been entered, channel selection unit 11 generates four binary signals or bits (binary digits) encoded, e.g., in binary coded decimal (BCD) format, to represent the corresponding digit. When both digits have been entered, channel selection unit 13 generates a CHANGE signal which is applied to a load (L) input of register 9 through an OR gate 15. This causes the 8 bits representing the tens and units digits of the channel generated by channel selection unit 13 to be entered into register 9. Channel selection unit 13 may also include so-called "up and down channel scanning" keys for increasing or decreasing the channel number stored in register 9. "RCA Television Service Data Supplement for the CTC 101 Series Chassis", File 1980 C-7-S1, published by RCA Corporation, Indianapolis, Indiana, discloses a channel selection system for generating binary signals representing the channel number of a selected channel in response to the operation of digit keys or channel scanning keys and is therefore incorporated by reference.

The present channel selection apparatus also includes registers 17 and 19 and associated control logic 21 providing both channel swapping and favorite channel operations. Three pushbuttons SW, FS and FR are provided by which a user initiates channel swapping, the storage of a favorite channel and the recall of a favorite channel, respectively. Register 19 stores the binary signals representing a channel number saved for swapping or as the favorite channel. Register 17 temporarily stores the binary signals stored in present channel register 9 before transfer to saved channel register 19 during the swapping operation and during the storage of a favorite channel. Control logic 21 includes a pulse generator 23 responsive to clock pulses generated by an oscillator 25 for sequentially generating three pulses P1, P2 and P3 (see FIG. 3) on three respective lines and gating logic 27 for selectively routing pulses P1, P2 and P3 to present channel register 9, temporary register 17 and saved channel register 19 to control the transfer of a channel number depending on which one of switches SW, FS or FR has been operated.

Each of switches SW, FS and FR comprises a normally opened momentary contact pushbutton switch, one terminal of which is connected to a source of positive voltage V+ corresponding to the "high" logic level. Circuitry for "debouncing" each one of switches SW, FS and FR, which is desirably provided to prevent the generation multiple rising and falling pulse edges as the contacts of a switch bounce, i.e., repeatedly close and open when a switch is first depressed, has been omitted from the Drawing for the sake of simplicity. Such "debouncing" circuitry is conventional and well known. When any of switches SW, FS or FR is closed, an OR gate 29 applies a START signal to pulse generator 23. As shown in FIG. 2, pulse generator 23 may simply comprise four cascaded D (data) type flip-flop stages and three AND gates 39, 41 and 43. With reference to FIG. 3, in response to the first clock pulse after the START signal goes "high", the Q output of first flip-flop 31 goes "high". Since the Q output of second flip-flop 33 is "high" at this time, the output of AND gate 39, which produces pulse P1, goes "high". In response to the second clock pulse, the Q output of second flip-flop 33 goes "high" and the Q output of second flip-flop 33 goes "low". As a result, the output of AND gate 39 goes "low". Pulse P2 and P3 are generated in a similar manner. It is noted that only one sequence of pulses is generated per switch closure no matter how long one of switches SW, FS or FR is held closed as is indicated with reference to the duration of the START pulse.

Delay elements 45, 47 and 49 generate "high" logic level pulses SW, FS and FR when respective ones of switches SW, FS and FR are closed. Pulse signals SW, FS and FR are coupled to gating logic 27 to control the routing of pulses P1, P2 and P3 to registers 9, 17 and 19. The durations of pulses SW, FS and FR are selected to be at least as long as the combined durations of pulses P1, P2 and P3 to ensure that pulses P1, P2 and P3 reach the appropriate ones of registers 9, 17 and 19. As shown in FIG. 2, delay elements 45, 47 and 49 may simply comprise three respective S/R (set-reset) flip-flops set when respective ones of switches SW, FS and FR close and reset when the Q output of D flip-flop 37 goes "high" at the end of pulse P3.

In operation, when switch SW is closed, the START signal is generated thereby initiating the generation of pulses P1, P2 and P3 and the SW pulse is generated thereby enabling AND gates 51, 53 and 55. Pulse P1 is routed through enabled AND gate 51 and an OR gate 57 to the load (L) input of temporary register 17. In response, the present channel number stored in present channel register 9 is entered into temporary register 17. Pulse P2 is routed through enabled AND gate 53, an OR gate 59 and OR gate 15 to the load input of present channel register 9. In response, the saved channel number stored in saved channel register 19 is entered into present channel register 9. Pulse P3 is routed through enabled AND gate 55 and an OR gate 61 to the load input of saved channel register 19. In response, the contents of temporary register 17 are entered into saved channel register 19. At the end of these operations, the presently selected channel and the saved channel have been interchanged.

When switch FS is closed, the START signal is generated thereby intiating the generation of pulses P1, P2 and P3 and the FS pulse is generated thereby enabling AND gates 63 and 65. Pulse P1 is routed through enabled AND gate 63 and OR gate 57 to the load input of temporary register 17. In response, the present channel number stored in present channel register 9 is stored in temporary register 17. Pulse P2 is routed through enabled AND gate 65 and OR gate 61 to the load input of saved channel register 19. In response, the contents of temporary register 17 are entered in saved channel register 19. At the end of these operations, the presently selected channel has been saved for latter recall.

When switch FR is closed, the START signal is generated thereby enabling the generation of pulses P1, P2 and P3 and the FR pulse is generated thereby enabling AND gate 67. Pulse P1 is routed through enabled AND gate 67, OR gate 59 and OR gate 15 to the load input of present channel register 9. In response, the saved channel stored in saved channel register 19 is entered into present channel register 9. At the end of these operations, the previously stored channel has been recalled.

The power for the channel selection apparatus within dotted line 69 is provided by a standby power supply 71. As a result, the contents of present channel register 9 and saved channel register 19 are maintained even when the receiver is in an off condition, i.e., when a power switch 73 associated with a main power supply 75 of the receiver is in the off position. To prevent random data, which may not correspond to a legitimate channel number, from being entered in present channel register 9 and saved channel register 19 when the receiver is initially turned on after it is first plugged in, power up apparatus is provided for entering a preselected legitimate channel number into present channel register 9 and saved channel register 19 when the receiver is first plugged in. Power up apparatus for entering a preselected legitimate channel number into a present channel number register of an electronic tuner such as register 9 is well known and may, e.g., comprise structure similar to that disclosed in RCA Service Data identified above and therefore need not be described in detail here. Briefly, such power up apparatus typically includes a power up detector for generating a power up pulse (PUP) when a standby voltage reaches a predetermined level and apparatus for entering the preselected channel in response to the PUP. To that extent, a power up detector 77 and a power up pulse generator 79 of the present selection apparatus cooperate for the same purpose and generate a first power up pulse PUP1 in response to which channel selection unit 13 enters a preselected channel number into present channel register 9. However, power up pulse generator 79 also sequentially generates second and third power up pulses, PUP2 and PUP3, respectively, after PUP1. Power up pulse generator 79 may be constructed in a manner similar to pulse generator 23 or share components thereof or simply comprise three cascade monostable multivibrators. Second power up pulse PUP1 is routed through OR gate 57 to the load input of temporary register 17. In response, the preselected channel member stored in present channel register 9 is entered into temporary register 17. Third power up pulse PUP3 is routed through OR gate 61 to the load input of saved channel register 19. In response, the contents of temporary register 17 are entered into saved channel register 19. As a result of these operations, a preselected channel number is entered into both present channel register 9 and saved channel register 19 when the receiver is first plugged in.

While the present channel selection apparatus has been described with reference to a specific logic arrangement, it will be appreciated other arrangements providing the same or similar functions may be employed. E.g., the position of temporary register 17 may be moved to a position between the output of saved channel register 19 and the input of present channel register 9 as indicated by dotted line 81. In that case, during the channel swapping operation, pulse P1 is routed to the load input of temporary register 17 (in position 81), pulse P2 is routed to the load input of saved channel register 19 and pulse P3 is routed to the load input of present channel register 9; during the favorite channel storage operation, pulse P1 is routed to the load input of saved channel register 19; and during the favorite channel recall operation, pulse P1 is routed to the load input of temporary storage register 17 and pulse P2 is routed to the load input of present channel register 9.

It is noted that since only one pulse is needed to recall a favorite channel with the logic configuration first described and to store a favorite channel with the logic configuration described in the preceeding paragraph, any of pulses P1, P2 or P3 may be used for such purposes. In the same vein, since only two pulses are needed to store a favorite channel with the logic configuration first described and to recall a favorite channel with the logic configuration described in the preceeding paragraph, either one of pulses P1 or P2 and then the next one of P2 and P3 can be used for such purposes.

It is also noted that if the swapping feature were omitted, temporary register 17 could be omitted and only a single pulse which was selectively routed to the load input of saved channel register 17 to store a favorite channel or to the load input of present channel register 9 to recall a stored favorite channel would be required.

Further, while the present channel selection apparatus has been described with reference to user controls which are completely incorporated within the receiver for the sake of simplicity, it will be appreciated that the channel swapping and favorite channel storing and recalling feature may be incorporated in, and possibly more preferential in, a remote control system. In such case, channel selection unit 13 would include a remote control transmitter unit with a keyboard having digit and/or channel scanning keys and a remote control receiver unit with a decoder for entering a presently selected channel into present channel register 9 in response to the operation of the keys on the remote control transmitter unit as is in fact disclosed in the RCA Service Data referenced above. In such a remote control system, the keyboard of the remote control transmitter unit would also include the SW, FS and FR switches and the decoder of the remote control receiver unit would generate "high" level logic signals corresponding to respective switch closures for application to control logic 21.

These and other modifications are intended to be within the scope of the present invention defined by the following claims.

What is claimed is:

1. In a tuning system apparatus comprising:
    present channel register means for storing, in binary form, the channel number of a presently selected channel;
    saved channel register means for storing, in binary form, the channel number of a previously stored channel;
    favorite channel store means for generating a favorite channel store signal;
    favorite channel recall means for generating a favorite channel recall signal independently of said favorite channel store signal;
    swap means for generating a channel swap signal independently of said favorite channel store and favorite channel recall signals; and
    control means for entering the contents of said present channel register means in said saved channel register means without disturbing the contents of said present channel register in response to said favorite channel store signal, for entering the contents of said saved channel register means in said present channel register means without disturbing the contents of said saved channel register in response to said favorite channel recall signal and for exchanging the contents of said present channel register means and said saved channel register means in response to said channel swap signal.

2. The apparatus recited in claim 1 wherein said control means includes:
    first coupling means for coupling the contents of said present channel register means to said saved channel register means;
    second coupling means for coupling the contents of said saved channel register means to said present channel register means
    temporary register means for storing data is included in one of said first and second coupling means;
    each of said present channel, saved channel and temporary register means including load means for causing the entry of data in response to a respective transfer signal;
    sequence means for sequentially generating three transfer signals; and
    gating means for selectively routing ones of said sequentially generated transfer signals to said load means of said present channel register means, said saved channel register means and said temporary register means through routes determined in response to said channel swap signal, said favorite channel store signal and said favorite recall signal.

3. The apparatus recited in claim 2 wherein:
    said temporary register means is included in said first coupling means; and
    said gating means selectively (a) routes the first one of said transfer signals to said load means of said temporary register means, the second one of said transfer signals to said load means of said present channel register means and the third one of said transfer signals to said load means of said saved channel register means in response to said channel swap signal, (b) routes one of the first one and the second one of said transfer signals to said load means of said temporary register means and the next one of said transfer signals generated after said one of the first one and the second one of said transfer signals to said load means of said saved channel register in response to said favorite channel store signal, and (c) routes one of the first one, the second one and the third one of said transfer signals to said load means of said present channel register means in response to said favorite channel recall signal.

4. The apparatus recited in claim 2 wherein:
said temporary register means for storing data is included in said second coupling means; and
said gating means selectively (a) routes the first one of said transfer signals to said load means of said temporary register means, the second one of said transfer signals to said load means of said saved channel register means and the third one of said transfer signals to said load means of said present channel register in response to said channel swap signal, (b) routes one of the first one, the second one and the third one of said transfer signals to said load means of said saved channel register means in response to said favorite channel store signal, and (c) routes one of the first one and the second one of said transfer signals to said load means of said temporary register means and the next one of said transfer signals generated after said one of the first one and the second one of said transfer signals to said load means of said present channel register means in response to said favorite channel recall signal.

5. The apparatus recited in claims 2, 3 or 4 wherein:
said sequence means sequentially generates three pulses as said three respective transfer signals; and
each of said channel swap means, said favorite channel store means and said favorite channel recall means includes respective delay means for causing the respective one of said channel swap, favorite channel store and favorite channel recall signals to have a duration at least as long as the combined durations of said three pulses.

* * * * *